(12) United States Patent
Komiyama

(10) Patent No.: US 12,306,254 B2
(45) Date of Patent: May 20, 2025

(54) BATTERY INFORMATION PROCESSING APPARATUS, BATTERY MANUFACTURING SUPPORT APPARATUS, BATTERY ASSEMBLY, BATTERY INFORMATION PROCESSING METHOD, AND METHOD OF MANUFACTURING BATTERY ASSEMBLY

(71) Applicant: TOYOTA JIDOSHA KABUSHIKI KAISHA, Toyota (JP)

(72) Inventor: Keita Komiyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 885 days.

(21) Appl. No.: 16/228,925

(22) Filed: Dec. 21, 2018

(65) Prior Publication Data

US 2019/0195953 A1    Jun. 27, 2019

(30) Foreign Application Priority Data

Dec. 25, 2017 (JP) ................. 2017-247734

(51) Int. Cl.
| | | |
|---|---|---|
| G01R 31/367 | (2019.01) | |
| B60L 58/10 | (2019.01) | |
| G01R 31/382 | (2019.01) | |
| G01R 31/392 | (2019.01) | |
| H01M 4/131 | (2010.01) | |
| H01M 10/0525 | (2010.01) | |

(Continued)

(52) U.S. Cl.
CPC ............ *G01R 31/367* (2019.01); *B60L 58/10* (2019.02); *G01R 31/382* (2019.01); *G01R 31/392* (2019.01); *H01M 4/131* (2013.01); *H01M 10/0525* (2013.01); *H01M 10/4207* (2013.01); *H01M 10/4285* (2013.01); *H01M 10/48* (2013.01); *H01M 10/482* (2013.01); *H01M 50/204* (2021.01); *H01M 2220/20* (2013.01)

(58) Field of Classification Search
CPC ........... H01M 10/4207; H01M 10/482; H01M 10/4285; H01M 10/0525; G01R 31/367; G01R 31/392; G01R 31/382; G01R 31/396
See application file for complete search history.

(56) References Cited

U.S. PATENT DOCUMENTS

2008/0315835 A1* 12/2008 Okumura .......... H01M 10/4207
                                                                320/116
2012/0015221 A1*  1/2012 Murase ................... B60L 58/16
                                                                429/90

(Continued)

FOREIGN PATENT DOCUMENTS

| JP | 2015-073427 A | 4/2015 |
|---|---|---|
| WO | 2015/033210 A1 | 3/2015 |

*Primary Examiner* — Stephen J Yanchuk
(74) *Attorney, Agent, or Firm* — Sughrue Mion, PLLC

(57) ABSTRACT

When ΔSOC (an amount of variation in SOC per one running) is greater than a second threshold value, a management server generates third rebuilding information indicating that a cell is a suited cell. When ΔSOC is greater than a first threshold value and smaller than the second threshold value, the management server generates second rebuilding information indicating that a cell is a suited cell. When ΔSOC is smaller than the first threshold value, the management server generates first rebuilding information indicating that a cell is a suited cell.

10 Claims, 9 Drawing Sheets

(51) Int. Cl.
*H01M 10/42* (2006.01)
*H01M 10/48* (2006.01)
*H01M 50/204* (2021.01)

(56) References Cited

U.S. PATENT DOCUMENTS

| | | | |
|---|---|---|---|
| 2018/0261893 A1* | 9/2018 | Fujita | H02J 7/0021 |
| 2019/0229539 A1* | 7/2019 | Hatano | H02J 7/00 |
| 2019/0329668 A1* | 10/2019 | Li | B60L 58/16 |
| 2020/0033415 A1* | 1/2020 | Furukawa | B60L 50/60 |
| 2020/0292619 A1* | 9/2020 | Tohara | G01R 31/3828 |
| 2020/0303732 A1* | 9/2020 | Waki | H01M 10/0566 |

* cited by examiner

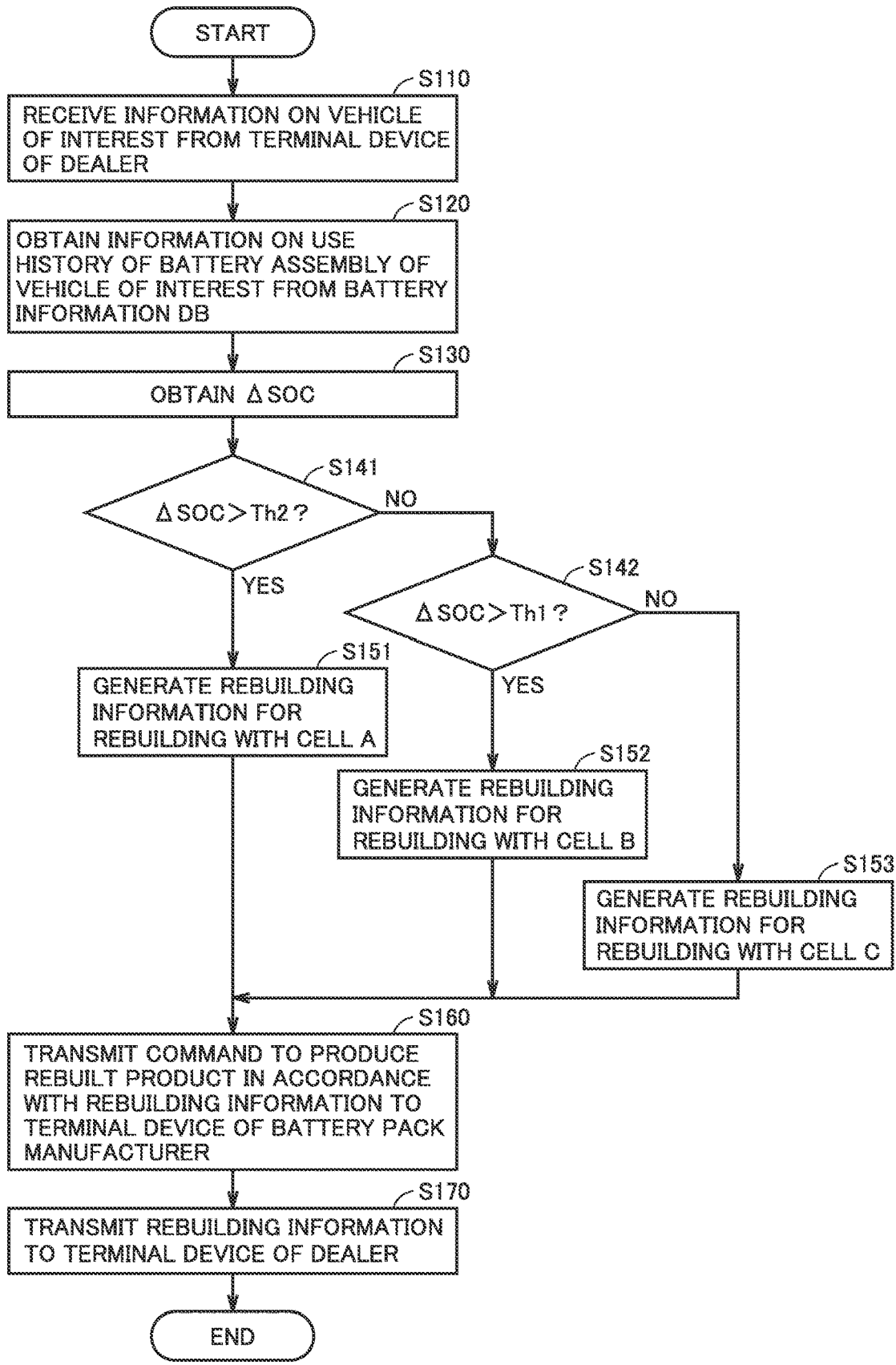

FIG.8

|  | THICKNESS OF POSITIVE ELECTRODE | WEIGHT PER UNIT AREA OF POSITIVE ELECTRODE | RESISTANCE AGAINST DETERIORATION |
|---|---|---|---|
| CELL A | SMALL | LIGHT | HIGH |
| CELL B | INTERMEDIATE | INTERMEDIATE | INTERMEDIATE |
| CELL C | LARGE | HEAVY | LOW |

FIG.9

|  | THICKNESS OF POSITIVE ELECTRODE | WEIGHT PER UNIT AREA OF POSITIVE ELECTRODE | RESISTANCE AGAINST DETERIORATION |
|---|---|---|---|
| CELL A | SMALL | LIGHT | HIGH |
| CELL B | LARGE | HEAVY | LOW |

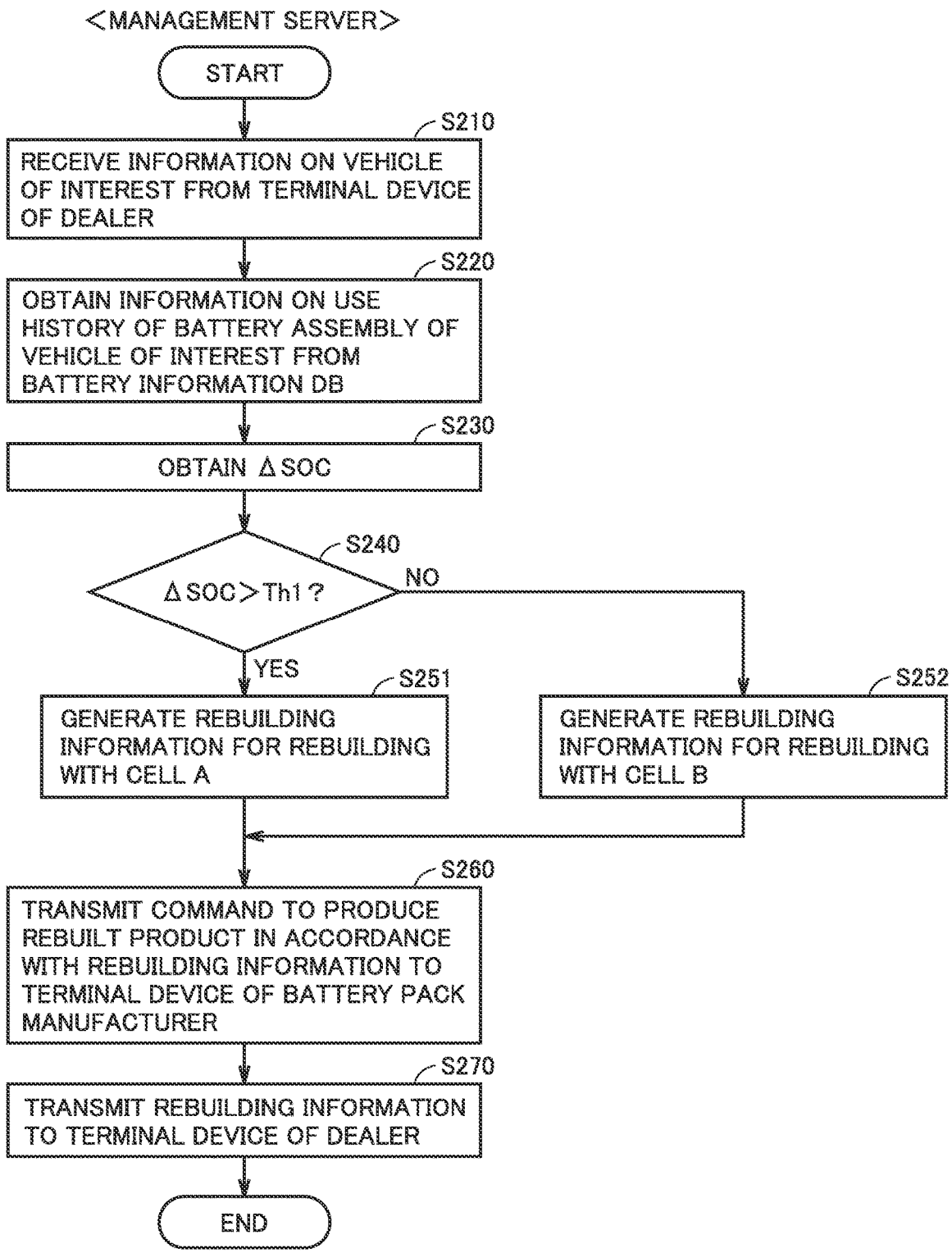

FIG.11

|  | THICKNESS OF POSITIVE ELECTRODE |
|---|---|
| CELL A | SMALL |
| CELL B | INTERMEDIATE |
| CELL C | LARGE |

FIG.12

|  | THICKNESS OF POSITIVE ELECTRODE | WEIGHT PER UNIT AREA OF POSITIVE ELECTRODE |
|---|---|---|
| CELL A | SMALL | EXTREMELY LIGHT |
| CELL B | SMALL | LIGHT |
| CELL C | INTERMEDIATE | INTERMEDIATE |
| CELL D | LARGE | HEAVY |
| CELL E | LARGE | EXTREMELY HEAVY |

FIG.13

|  |  | EMBODIMENT | COMPARATIVE EXAMPLE |
|---|---|---|---|
| BEFORE REBUILDING | ΔSOC | 76%(SOC:91%−15%) | |
| AT THE TIME OF REBUILDING | REBUILT PRODUCT | CELL A | CELL B |
| AFTER REBUILDING | CAPACITY RETENTION AFTER TRAVEL OF APPROXIMATELY 56000 km | 98.5% | 90.8% |
| | POSSIBLE DISTANCE OF TRAVEL | APPROXIMATELY 296km | APPROXIMATELY 272km |

BATTERY INFORMATION PROCESSING APPARATUS, BATTERY MANUFACTURING SUPPORT APPARATUS, BATTERY ASSEMBLY, BATTERY INFORMATION PROCESSING METHOD, AND METHOD OF MANUFACTURING BATTERY ASSEMBLY

This nonprovisional application is based on Japanese Patent Application No. 2017-247734 filed with the Japan Patent Office on Dec. 25, 2017, the entire contents of which are hereby incorporated by reference.

BACKGROUND

Field

The present disclosure relates to a battery information processing apparatus, a battery manufacturing support apparatus, a battery assembly, a battery information processing method, and a method of manufacturing a battery assembly, and particularly to a technique for manufacturing a battery assembly by replacing at least some of a plurality of cells constituting the battery assembly mounted on a vehicle.

Description of the Background Art

A battery assembly is constituted of a plurality of secondary batteries. A battery assembly of a high capacity is obtained by combining a plurality of secondary batteries. In order to use a battery assembly for a long period of time, however, maintenance of the battery assembly is required. Japanese Patent Laying-Open No. 2015-73427 discloses a battery management system relating to maintenance of a battery assembly. The battery management system determines whether or not maintenance of a battery assembly is necessary based on variation in characteristics of a plurality of battery blocks included in the battery assembly, and when maintenance of the battery assembly is necessary, the battery management system gives information on a battery assembly to an interested party. Each secondary battery constituting the battery assembly is also referred to as a "cell" below.

In general, in replacing a cell of a battery assembly mounted on a vehicle, it is replaced with a cell identical in specifications (a material or a structure) to an existing cell. Therefore, the existing cell is often replaced with a cell identical in performance thereto. Usage of a vehicle, however, is different among users. Therefore, it is not necessarily appropriate to replace an existing cell with a cell identical in performance thereto. For example, a user who uses a vehicle in such a manner as accelerating deterioration of a cell may invite decrease in possible distance of travel by EV running (a possible distance of travel of a vehicle with only electric power from a battery pack) or increase in frequency of replacement of a cell. Though a battery management system described in Japanese Patent Laying-Open No. 2015-73427 is useful in that maintenance of a battery assembly can be done at appropriate timing, there is a room for further improvement in allowing selection of a cell suited to replacement of a cell from among a plurality of types of cells (replacement cells).

SUMMARY

The present disclosure was made to achieve such an object, and an object of the present disclosure is to provide a battery information processing apparatus and a battery information processing method capable of providing information for allowing selection of an appropriate replacement cell in consideration of a difference in usage of a vehicle for each user.

Another object of the present disclosure is to provide a battery manufacturing support apparatus which allows selection of an appropriate replacement cell in consideration of a difference in usage of a vehicle for each user.

Another object of the present disclosure is to provide a battery assembly manufactured by selecting an appropriate replacement cell in consideration of a difference in usage of a vehicle for each user and a method of manufacturing the same.

A battery information processing apparatus according to the present disclosure is a battery information processing apparatus which processes information for manufacturing a battery assembly including a plurality of cells, and the battery information processing apparatus includes a battery information obtaining device and a replacement information generator. The battery information obtaining device is configured to obtain an amount of variation in SOC (State Of Charge) per one running of the battery assembly used in a vehicle. The replacement information generator is configured to generate replacement information for selecting a suited cell suited to replacement of a cell included in the battery assembly from among replacement cells by using the amount of variation in SOC. The replacement cells are replacable with the cell. The replacement information generator is configured to generate first replacement information when the amount of variation in SOC is smaller than a first threshold value, and generate second replacement information when the amount of variation in SOC is greater than the first threshold value. The first replacement information indicates that a first cell is the suited cell. The second replacement information indicates that a second cell is the suited cell, the second cell being determined as being less likely to deteriorate than the first cell based on a prescribed indicator, the prescribed indicator indicating less likeliness of deterioration of a cell.

A battery information processing method according to the present disclosure is a battery information processing method of processing information for manufacturing a battery assembly including a plurality of cells, and the battery information processing method includes obtaining an amount of variation in SOC per one running of the battery assembly used in a vehicle and generating replacement information for selecting a suited cell suited to replacement of a cell included in the battery assembly from among replacement cells by using the amount of variation in SOC. The replacement cells are replacable with the cell. The generating replacement information includes comparing the amount of variation in SOC with a first threshold value (Th1), generating first replacement information when the amount of variation in SOC is smaller than the first threshold value, and generating second replacement information when the amount of variation in SOC is greater than the first threshold value. The first replacement information indicates that a first cell is the suited cell. The second replacement information indicates that a second cell is the suited cell, the second cell being determined as being less likely to deteriorate than the first cell based on a prescribed indicator, the prescribed indicator indicating less likeliness of deterioration of a cell.

Electric power stored in a cell can be used for running of a vehicle. When the vehicle runs with electric power stored in the cell, an SOC of the cell lowers. The SOC represents a remaining amount of electric power stored in a cell, and represents an amount of stored electric power with respect to a fully charged state, for example, as 0 to 100%. When a cell included in a battery assembly deteriorates, a cell capacity (an amount of electric power which can be stored in a cell) lowers. A rate of deterioration of a cell varies depending on usage of a battery assembly. Usage of a battery assembly is different depending on usage of a vehicle by a user. In a battery assembly used in such a manner that an amount of variation in SOC per one running of a vehicle is small (first usage), deterioration of a cell tends to be slow. In contrast, in a battery assembly used in such a manner that an amount of variation in SOC per one running of a vehicle is large (second usage), deterioration of a cell tends to be fast.

The battery information processing apparatus and the battery information processing method according to the present disclosure are configured as above. Thus, for a battery assembly used in the second usage, a high capacity of the battery assembly can be maintained for a long period of time by manufacturing the battery assembly with cells less likely to deteriorate (second cells). In the first usage, deterioration of a battery assembly does not give rise to a problem. Therefore, for a battery assembly used in the first usage, while a high capacity of the battery assembly is maintained for a long period of time, yet another advantage can be obtained by manufacturing the battery assembly with cells (first cells) advantageous in aspects other than deterioration. For example, a high-capacity battery assembly is obtained by employing a cell suited to increase in capacity as a first cell (replacement cell). Use of an inexpensive cell as a first cell (replacement cell) is advantageous in terms of cost. According to the battery information processing apparatus and the battery information processing method, information (replacement information) for manufacturing a battery assembly with an appropriate replacement cell in consideration of a difference in usage of a vehicle for each user can thus be provided.

"Obtaining" an amount of variation in SOC encompasses obtaining an amount of variation in SOC by generating the same in a battery information processing apparatus and obtaining an amount of variation in SOC by receiving the amount of variation in SOC generated outside the battery information processing apparatus (for example, a vehicle incorporating a battery assembly).

A server which manages battery information or a terminal device different from such a server may be adopted as the battery information processing apparatus. When a terminal device is adopted as the battery information processing apparatus, for example, the terminal device may obtain an amount of variation in SOC obtained by the server from the server and generate replacement information.

The replacement information generator may be configured to generate third replacement information when the amount of variation in SOC is greater than a second threshold value (Th2). The second threshold value is greater than the first threshold value (Th1). The third replacement information indicates that a third cell is the suited cell, the third cell being determined as being less likely to deteriorate than the second cell based on the indicator. When the amount of variation in SOC is greater than the first threshold value and smaller than the second threshold value, the replacement information generator may be configured to generate the second replacement information.

According to such a configuration, a battery assembly can be categorized into three groups depending on usage of a vehicle by a user so that an appropriate replacement cell suited to each battery assembly can be selected. Appropriateness of a replacement cell is higher in an example of categorization into three groups than in an example of categorization into two groups.

The vehicle (the vehicle incorporating a battery assembly to be manufactured) may be configured such that the plurality of cells are chargeable with electric power from an external power supply outside the vehicle. The amount of variation in SOC may be calculated by using an amount of lowering in SOC during a period from end of charging by the external power supply until start of next charging. Alternatively, the amount of variation in SOC may be calculated by using an amount of increase in SOC during a period from start of charging by the external power supply until end of that charging.

According to such a configuration, an appropriate replacement cell can be selected for a battery assembly incorporated in an externally chargeable vehicle.

The replacement cells may each be determined as being less likely to deteriorate based on the indicator as a positive electrode is smaller in thickness. Alternatively, the replacement cells may each be determined as being less likely to deteriorate based on the indicator as a weight per unit area of a positive electrode is lighter.

Alternatively, the replacement cell may be determined as being less likely to deteriorate based on the indicator as a positive electrode is smaller in thickness and may be determined as being less likely to deteriorate based on the indicator as a weight per unit area of the positive electrode is lighter.

According to such a configuration, a cell suited to increase in capacity can be employed for a first cell (replacement cell). Therefore, according to the battery information processing apparatus configured as above, for a battery assembly used in the first usage, a battery assembly higher in capacity can be obtained by replacement of a cell.

The battery information obtaining device may be configured to obtain an amount of variation in SOC of the battery assembly for each of a plurality of times of running, and find a median value of obtained amounts of variation in SOC as the amount of variation in SOC per one running.

In the battery information processing apparatus configured as such, a median value of amounts of variation in SOC corresponds to an amount of variation in SOC per one running. The median value is a value located in the center when amounts of variation in SOC are aligned in the order of magnitude. The median value is more likely to reflect common usage by a user than an average value. For example, when a median value (an amount of variation in SOC per one running) of data on a plurality of times of running is found for a user who drives a long distance only on weekends, extremely large data (data on running on weekends) is excluded. The median value is thus more likely to reflect data on common running. Therefore, according to the configuration above, appropriateness of a replacement cell can be enhanced.

A battery manufacturing support apparatus according to the present disclosure is a battery manufacturing support apparatus for manufacturing a battery assembly by replacing at least one of a plurality of cells constituting the battery assembly with a suited cell selected from among replacement cells, and the battery manufacturing support apparatus includes an obtaining device configured to obtain replacement information generated by any battery information processing apparatus described above and a selector configured to select the suited cell in accordance with the replacement information obtained by the obtaining device.

According to the battery manufacturing support apparatus, an appropriate replacement cell can be selected in consideration of a difference in usage of a vehicle for each user and a battery assembly can be manufactured with the selected replacement cell.

A battery assembly according to the present disclosure is manufactured in accordance with the replacement information generated by any battery information processing apparatus described above.

The battery assembly includes an appropriate replacement cell suited to usage of a vehicle by a user. Such a battery assembly is suitable for a user.

A method of manufacturing a battery assembly according to the present disclosure is a method of manufacturing a battery assembly including a plurality of cells, and the method includes obtaining replacement information for selecting a suited cell suited to replacement of a cell included in the battery assembly from among replacement cells and manufacturing the battery assembly by using the suited cell selected in accordance with the obtained replacement information. The replacement cells are replacable with the cell. The replacement information is information generated by using an amount of variation in SOC per one running of the battery assembly used in a vehicle. The replacement information indicates that a first cell is the suited cell when the amount of variation in SOC is smaller than a first threshold value and indicates that a second cell is the suited cell when the amount of variation in SOC is greater than the first threshold value, the second cell being determined as being less likely to deteriorate than the first cell based on a prescribed indicator, the prescribed indicator indicating less likeliness of deterioration of a cell.

According to the method of manufacturing a battery assembly, a battery assembly including an appropriate replacement cell suited to usage of a vehicle by a user can be manufactured. A battery assembly suitable for a user is obtained.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 7 is a flowchart illustrating a procedure in processing performed by a management server.

FIG. 8 is a diagram showing replacement cells (cells A to C) selected in steps S151 to S153 in FIG. 7.

FIG. 9 is a diagram showing replacement cells (cells A and B) to be used for rebuilding in a modification of an embodiment.

FIG. 10 is a flowchart illustrating a procedure in processing performed by the management server in the modification in which a replacement cell shown in FIG. 9 is adopted.

FIG. 11 is a diagram showing replacement cells (cells A to C) to be used for rebuilding in a modification of the embodiment.

FIG. 12 is a diagram showing replacement cells (cells A to E) to be used for rebuilding in a modification of the embodiment.

FIG. 13 is a diagram showing a result of evaluation of a capacity retention before and after running and a possible distance of travel of a rebuilt product according to an Example and a rebuilt product according to a Comparative Example.

DESCRIPTION OF THE PREFERRED EMBODIMENTS

Figure 1:
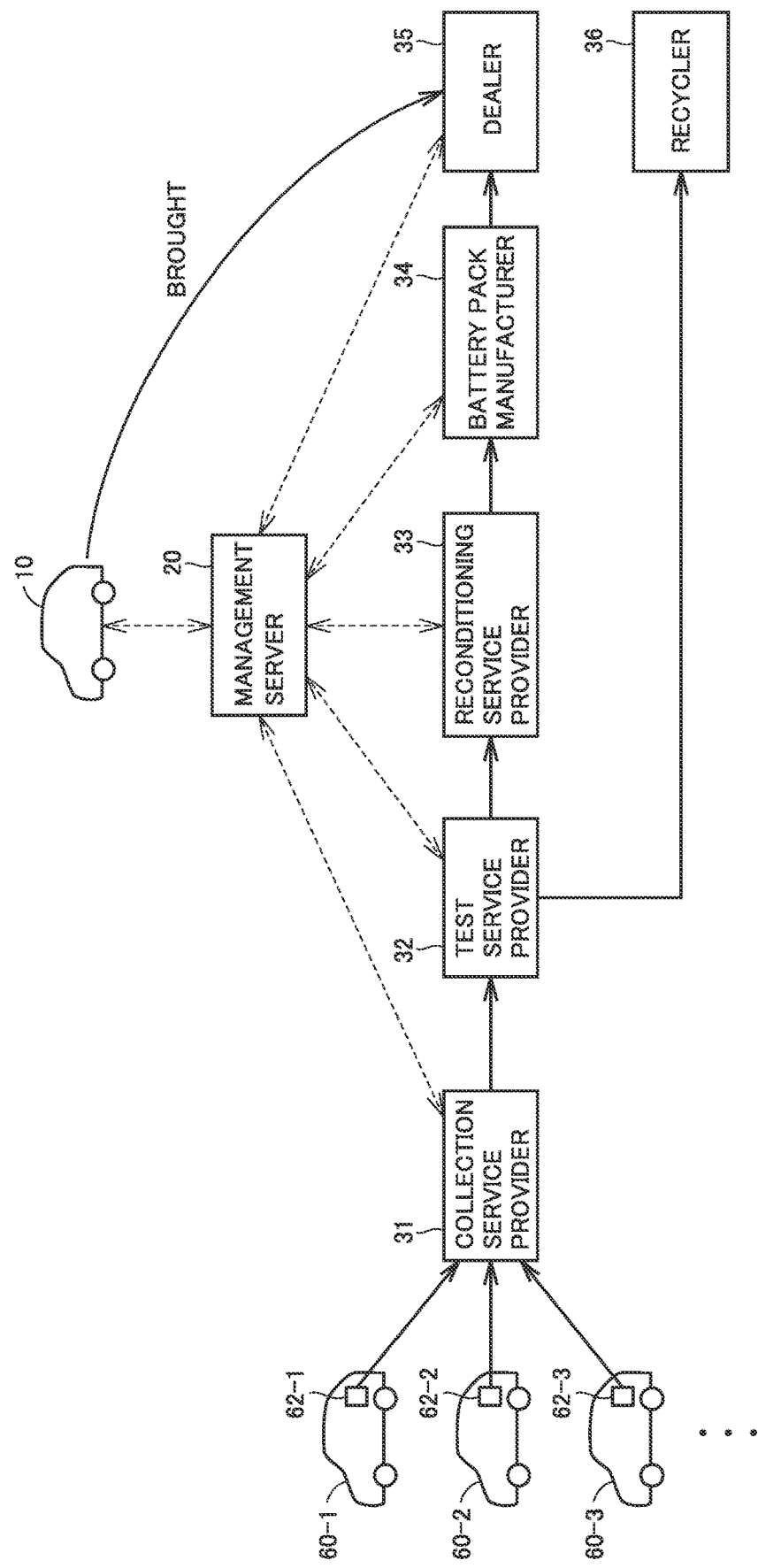
FIG. 1 is a diagram showing one manner of distribution from collection to manufacturing and sales of battery packs in the present disclosure.

An embodiment of the present disclosure will be described below in detail with reference to the drawings. The same or corresponding elements in the drawings have the same reference characters allotted and description thereof will not be repeated.

FIG. 1 is a diagram showing one manner of distribution from collection to manufacturing and sales of battery packs in the present disclosure. A manner of distribution shown in FIG. 1 is referred to as a "battery distribution model" below. In the battery distribution model, used battery packs are collected from a plurality of vehicles each incorporating battery packs, and battery packs are manufactured by using recyclable cells included in the collected battery packs and then sold.

"Manufacturing of a battery pack" in the present disclosure means manufacturing of a battery pack by replacing at least one of a plurality of cells included in a battery pack with replacement cells. Though the replacement cell is basically a recyclable cell taken out of a collected battery pack, it may be a new cell.

Referring to FIG. 1, a collection service provider 31 collects used battery packs from vehicles 60-1, 60-2, . . . . Vehicles 60-1, 60-2, . . . include battery packs 62-1, 62-2, . . . , respectively, and each battery pack includes a plurality of cells. Collection service provider 31 disassembles collected battery packs and takes out cells from the battery packs. Each cell or each module which is a set of cells may be taken out of a battery pack.

In the battery distribution model, an ID for identifying each cell is provided and information on each cell is managed by a management server 20. Collection service provider 31 transmits an ID of each cell taken out of a battery pack to management server 20 by using a terminal device (not shown).

A test service provider 32 tests performance of each cell collected by collection service provider 31. Specifically, test service provider 32 tests electrical characteristics of a collected cell. For example, test service provider 32 tests electrical characteristics such as a capacity, a resistance value, an open circuit voltage (OCV), and a state of charge (SOC) of a cell. Test service provider 32 makes classification into a recyclable cell and a non-recyclable cell based on a result of the test, passes recyclable cells to a reconditioning service provider 33, and passes non-recyclable cells to a recycler 36. A result of test of each cell is transmitted to management server 20 by using a terminal device (not shown) of test service provider 32.

Reconditioning service provider 33 performs processing for reconditioning a cell determined as being recyclable by test service provider 32 (a replacement cell). By way of example, reconditioning service provider 33 restores a capacity of a cell by discharging the cell to an overdischarged state or charging the cell to an overcharged state. A cell determined as being minor in lowering in performance in the test by test service provider 32 does not have to be subjected to a reconditioning process by reconditioning service provider 33. A result of reconditioning of each cell is transmitted to management server 20 by using a terminal device (not shown) of reconditioning service provider 33.

A battery pack manufacturer 34 manufactures a battery pack by using cells reconditioned by reconditioning service provider 33. In this embodiment, battery pack manufacturer 34 obtains information for manufacturing a battery pack from management server 20 by using a terminal device (not shown) and manufactures a battery pack in accordance with the obtained information.

Specifically, in the embodiment, rebuilding information for manufacturing a rebuilt product of a battery pack to be mounted on a vehicle 10 is generated by management server 20 and transmitted to a terminal device of battery pack manufacturer 34. Battery pack manufacturer 34 manufactures a rebuilt product of a battery pack for vehicle 10 by replacing at least some of a plurality of cells included in a battery pack of vehicle 10 with cells (replacement cells) reconditioned by reconditioning service provider 33 in accordance with the rebuilding information.

A dealer 35 sells a battery pack manufactured by battery pack manufacturer 34 for vehicle use or for stationary use in a house or the like. In the embodiment, vehicle 10 is brought to dealer 35 and dealer 35 replaces battery packs in vehicle 10 with rebuilt products manufactured by battery pack manufacturer 34.

Recycler 36 disassembles cells determined as being non-recyclable by test service provider 32 for reclamation for use as new cells or as source materials for other products.

Figure 2:
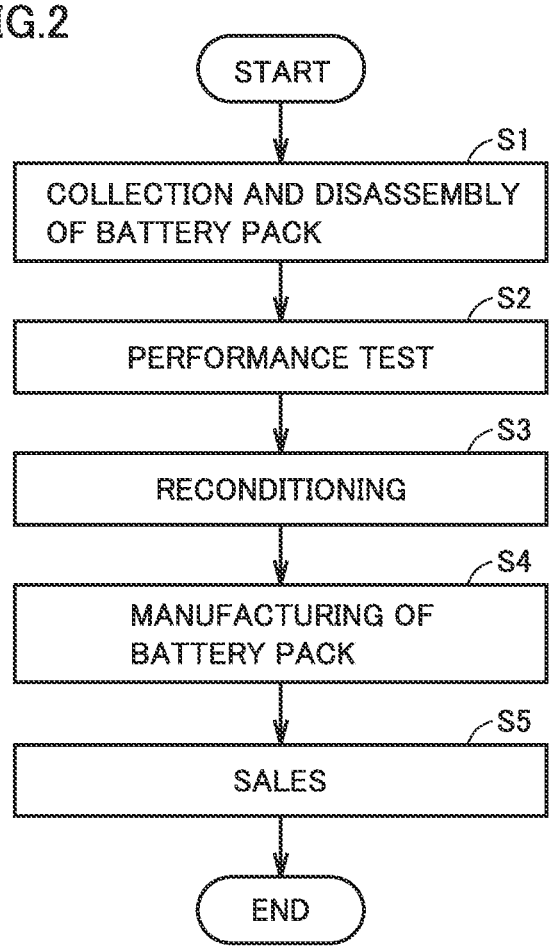
FIG. 2 is a diagram showing a flow of processing in a battery distribution model shown in FIG. 1.

FIG. 2 is a diagram showing a flow of processing in the battery distribution model shown in FIG. 1. Referring FIG. 1 together with FIG. 2, collection service provider 31 collects used battery packs from vehicles 60-1, 60-2, . . . and disassembles them (step S1) and takes out used cells from the battery packs.

Each used cell taken out of the battery pack is passed to test service provider 32 and test service provider 32 tests performance of each used cell (step S2). Specifically, electrical characteristics (a capacity and the like) of each cell are tested as described above. As a result of the performance test, the cells are classified into recyclable cells and non-recyclable cells and the non-recyclable cells are passed to recycler 36.

The cell determined as being recyclable as a result of the performance test is passed to reconditioning service provider 33 and reconditioning service provider 33 performs a process for reconditioning the cell (step S3). For example, a capacity of a cell is restored by discharging the cell to the overdischarged state or charging the cell to the overcharged state.

The reconditioned cell is passed to battery pack manufacturer 34 and battery pack manufacturer 34 manufactures a battery pack by using the reconditioned cell (step S4). In the embodiment, information (rebuilding information) for manufacturing a battery pack is generated by management server 20 and battery pack manufacturer 34 manufactures a battery pack in accordance with the rebuilding information.

The battery pack manufactured by battery pack manufacturer 34 is passed to dealer 35 and sold for vehicle use or for stationary use in a house or the like (step S5).

Referring again to FIG. 1, vehicle 10 is a vehicle on which a battery pack is mounted (not shown) and for which a battery pack is rebuilt in the battery distribution model (vehicle 10 may be referred to as a "vehicle of interest" below). As described above, in the embodiment, a battery pack for vehicle 10 is reconstructed by replacing at least some of a plurality of cells included in the battery pack mounted on vehicle 10 with replacement cells.

Though details will be described later, generally, information on a use history of a battery assembly in a battery pack mounted on vehicle 10 is transmitted from vehicle 10 to management server 20 and accumulated in management server 20. Management server 20 accumulates information on recyclable cells included in battery packs 62-1, 62-2, . . . collected from vehicles 60-1, 60-2, . . . incorporating battery packs.

When a user of vehicle 10 (vehicle of interest) who desires replacement of a battery pack brings vehicle 10 to dealer 35, information for identifying vehicle 10 is transmitted from a terminal device of dealer 35 to management server 20.

Management server 20 finds an amount of variation in SOC per one running of vehicle 10 by using accumulated information on a use history of the battery assembly of vehicle 10. Then, management server 20 generates rebuilding information for constructing a rebuilt product of a battery pack to be mounted on vehicle 10 by referring to the amount of variation in SOC per one running of vehicle 10 and information on recyclable cells.

The generated rebuilding information is transmitted from management server 20 to a terminal device of battery pack manufacturer 34. Battery pack manufacturer 34 selects a cell based on the rebuilding information from among reconditioned recyclable cells and manufactures a rebuilt product of the battery pack for vehicle 10. The manufactured rebuilt product is delivered to dealer 35 to which vehicle 10 has been brought and the battery pack of vehicle 10 is replaced with the rebuilt product at dealer 35.

Though collection service provider 31, test service provider 32, reconditioning service provider 33, the battery pack manufacturer, and dealer 35 are individual service providers above, classification of the service providers is not limited as such. For example, a single service provider may serve as test service provider 32 and reconditioning service provider 33. Alternatively, collection service provider 31 may be divided into a service provider which collects battery packs and a service provider which disassembles collected battery packs. Locations of each service provider and each dealer are not limited. Locations of each service provider and each dealer may be different or a plurality of service providers or dealers may be located at the same place.

Though each cell is tested and reconditioned above, each module which is a set of some cells may be tested or reconditioned.

Figure 3:
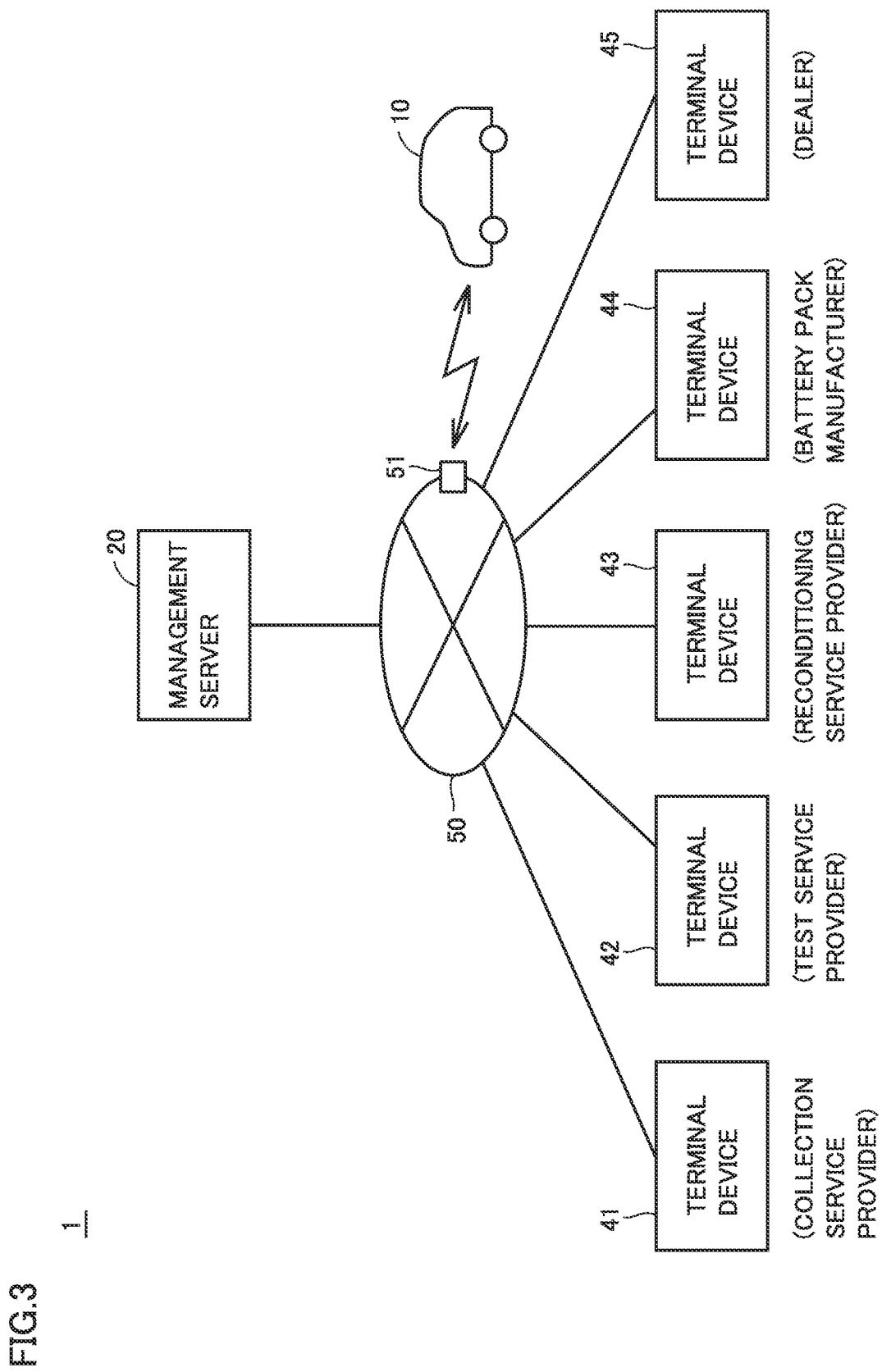
FIG. 3 is a diagram showing an exemplary configuration of a battery management system applied to the battery distribution model shown in FIG. 1.

FIG. 3 is a diagram showing an exemplary configuration of a battery management system applied to the battery distribution model shown in FIG. 1.

Referring to FIG. 3, a battery management system 1 includes vehicle 10, management server 20, terminal devices 41 to 45, and a communication network 50.

Vehicle 10, management server 20, and terminal devices 41 to 45 are configured to be able to communicate with one another through communication network 50 such as the Internet or telephone lines. Vehicle 10 is configured to be able to transmit and receive information to and from a base station 51 on communication network 50 through wireless communication.

Terminal device 41 is a terminal device of collection service provider 31 and terminal device 42 is a terminal device of test service provider 32. Terminal device 43 is a terminal device of reconditioning service provider 33 and terminal device 44 is a terminal device of battery pack manufacturer 34. Terminal device 45 is a terminal device of dealer 35.

Figure 4:
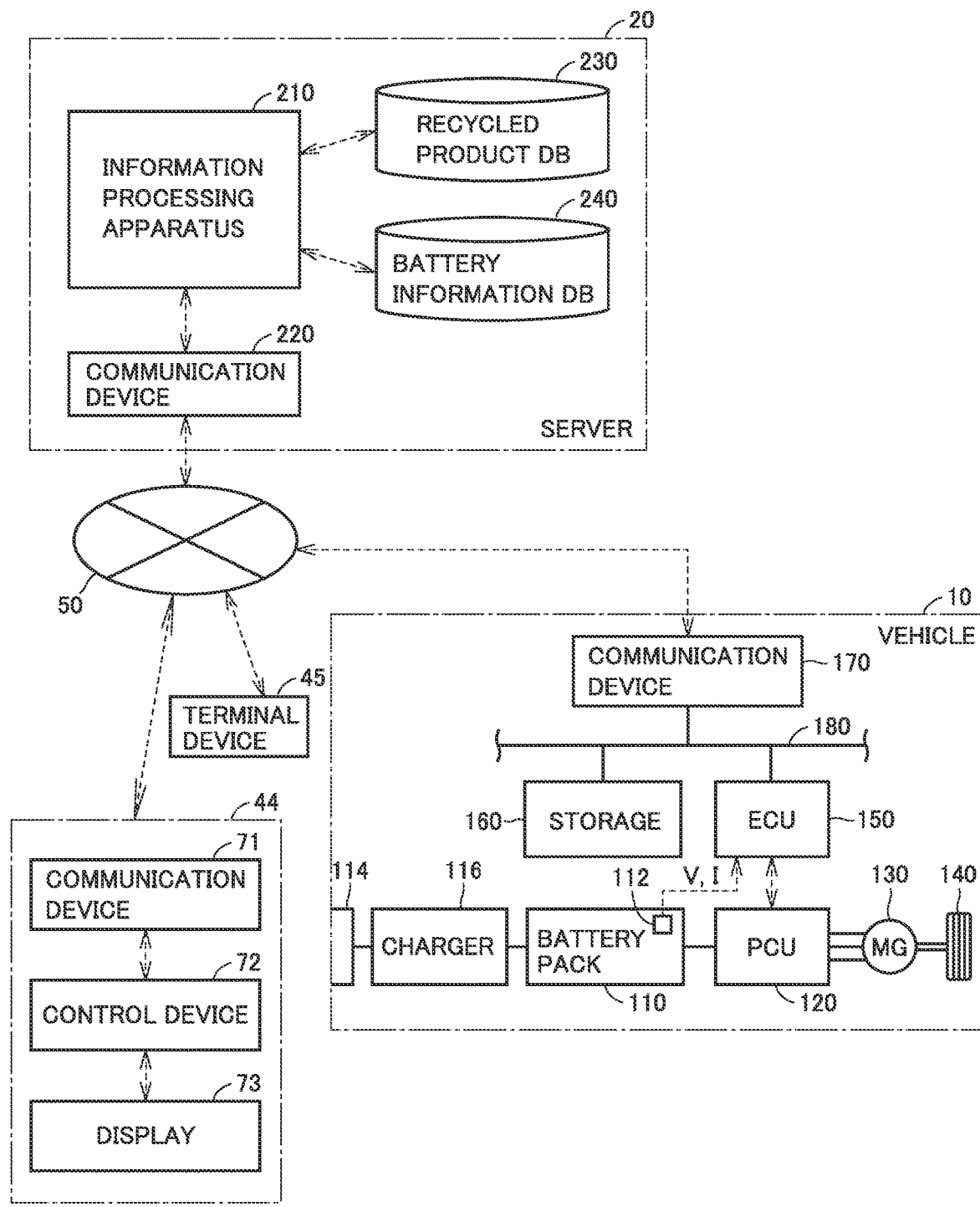
FIG. 4 is a diagram showing in detail a configuration of a vehicle, a management server, and a terminal device of a battery pack manufacturer shown in FIG. 3.

FIG. 4 is a diagram showing in detail a configuration of vehicle 10, management server 20, and terminal device 44 of battery pack manufacturer 34 shown in FIG. 3. Referring to FIG. 4, vehicle 10 includes a battery pack 110, a battery monitoring unit 112, an inlet 114, a charger 116, a power control unit (PCU) 120, a motor generator (MG) 130, a drive wheel 140, an electronic control unit (ECU) 150, a storage 160 (for example, a non-volatile memory), a communication device 170, and a communication line 180. ECU 150, storage 160, and communication device 170 are connected to one another through communication line 180 and configured to be able to transmit and receive information to and from one another.

Vehicle 10 is configured such that a plurality of cells in a battery pack are chargeable with electric power from an external power supply outside the vehicle. Charging of a cell in a battery pack with electric power from an external power supply outside the vehicle is referred to as "external charging" below. Vehicle 10 is an externally chargeable vehicle incorporating an externally chargeable battery pack. Vehicle 10 may be an electric vehicle which can run only with electric power stored in a battery pack or a plug-in hybrid vehicle which can run with both of electric power stored in a battery pack and output from an engine. A method of power feed in external charging may be a method of supply of electric power to a vehicle through a cable by an external power supply or a method of wireless supply of electric power to a vehicle without using a cable by an external power supply (wireless power feed).

Battery pack 110 includes a battery assembly constituted of a plurality of cells and includes, for example, a battery assembly in which a plurality of lithium ion secondary batteries are connected in series and/or in parallel as appropriate. Battery pack 110 supplies electric power for driving drive wheel 140 to PCU 120 by means of MG 130.

Battery monitoring unit 112 includes various sensors and is configured to monitor a state of battery pack 110. Battery monitoring unit 112 includes, for example, a voltage sensor and a current sensor. The voltage sensor detects a voltage of a battery assembly in battery pack 110 and outputs a detection value V to ECU 150. The current sensor detects a current of a battery assembly in battery pack 110 and outputs a detection value I to ECU 150. Battery monitoring unit 112 may further include a temperature sensor which detects a temperature of a battery assembly in battery pack 110.

A connector (not shown) of a charge cable is connected to inlet 114. As the connector is connected to inlet 114, electric power can be supplied from an external power supply (not shown) of charging facilities through a charge cable to battery pack 110.

Charger 116 includes a rectifier circuit and a converter (neither of which is shown). Alternating-current (AC) power from an external power supply is sent to charger 116 through a charge cable and inlet 114 and converted to direct-current (DC) power by the rectifier circuit of charger 116. DC power converted by the rectifier circuit is up-converted or down-converted by the converter of charger 116 and supplied to battery pack 110.

MG 130 is a rotating electric machine and it is implemented, for example, by a three-phase AC motor generator. MG 130 is driven by PCU 120 and rotates drive wheel 140. MG 130 can also carry out regeneration during braking of vehicle 10. Electric power generated by MG 130 is rectified by PCU 120 and battery pack 110 is charged therewith.

PCU 120 includes an inverter and a converter (neither of which is shown), and drives MG 130 in accordance with a drive signal from ECU 150. PCU 120 converts electric power stored in battery pack 110 into AC power and supplies AC power to MG 130 during driving for power running by MG 130, and rectifies electric power generated by MG 130 and supplies electric power to battery pack 110 during driving for regeneration by MG 130 (during braking of vehicle 10).

ECU 150 includes a central processing unit (CPU), a memory (a read only memory (ROM) and a random access memory (RAM)), and an input and output port for input and output of various signals (none of which is shown). ECU 150 controls PCU 120 and charging and discharging of battery pack 110 such that a desired state of vehicle 10 is achieved. ECU 150 calculates an SOC of battery pack 110 by using a voltage value and a current value (detection values V and I received from battery monitoring unit 112) of a battery assembly in battery pack 110. Then, the ECU outputs information on a use history of battery pack 110 including the calculated SOC to storage 160.

In battery management system 1, rebuilding information for manufacturing a rebuilt product is generated in management server 20. ECU 150 generates information on a use history of battery pack 110, has storage 160 accumulate the use history information, periodically reads the information on the use history of battery pack 110 from storage 160, and transmits the use history information to management server 20 through communication device 170.

Management server 20 includes an information processing apparatus 210, a communication device 220, a recycled product database (DB) 230, and a battery information database (DB) 240.

Recycled product DB 230 accumulates information on cells (replacement cells) included in secondhand battery packs 62-1, 62-2, . . . (FIG. 1) collected by collection service provider 31 and determined as being recyclable by test service provider 32 in association with an ID for identifying each cell. This information includes information on a cell in an initial state (for example, traceability data stored at the time of shipment) and information on a used cell. The traceability data of a cell includes information representing less likeliness of deterioration of each cell (a thickness and a weight per unit area of an electrode). The information on a used cell is collected, for example, by evaluating performance of each cell (evaluating a state of deterioration) in test service provider 32, and includes an indicator indicating a state of deterioration of each cell and less likeliness of deterioration of each cell (a rate of deterioration, a capacity of a cell, and a resistance of a cell).

Battery information DB 240 stores initial information of battery pack 110 (for example, traceability data stored at the time of shipment) and battery information periodically received from vehicle 10 (for example, information on a use history of battery pack 110) in association with an ID for identifying vehicle 10. The traceability data of battery pack 110 includes information on process variation of a cell. The information on process variation of a cell includes process variation data on each of a thickness and a weight per unit area of an electrode (for example, an upper limit value, a median value, and a lower limit value of process variation). Information on a use history of battery pack 110 is periodically collected by ECU 150 of vehicle 10 and transmitted from vehicle 10 to management server 20 at prescribed timing.

Information processing apparatus 210 includes a CPU, a memory, and an input and output buffer (none of which is shown). When information processing apparatus 210 receives information for identifying vehicle 10 of which battery pack 110 is to be replaced from terminal device 45 of dealer 35 through communication device 220, it generates rebuilding information for rebuilding battery pack 110 by using data on vehicle 10 stored in battery information DB 240 and data on recyclable cells (replacement cells) stored in recycled product DB 230. Details of specific processing for generating rebuilding information will be described later.

Information processing apparatus 210 transmits the generated rebuilding information to terminal device 44 of battery pack manufacturer 34 through communication device 220. Battery pack manufacturer 34 produces a rebuilt product of battery pack 110 of vehicle 10 in accordance with the rebuilding information generated by management server 20.

Terminal device 44 of battery pack manufacturer 34 includes a communication device 71, a control device 72, and a display 73. Communication device 71 obtains rebuilding information generated by management server 20 from management server 20. Control device 72 selects a suited cell from among replacement cells reconditioned by reconditioning service provider 33 in accordance with the obtained rebuilding information, and has display 73 show information on the selected suited cell. Battery pack manufacturer 34 manufactures a rebuilt product of battery pack 110 for vehicle 10 based on the information on the suited cell shown on display 73.

Terminal device 44 corresponds to one embodiment of the "battery manufacturing support apparatus" in the present disclosure. Communication device 71 corresponds to one embodiment of the "obtaining device" in the present disclosure and control device 72 corresponds to one embodiment of the "selector" in the present disclosure.

Usage of vehicle 10 (usage of battery pack 110) is different for each user. When an amount of variation in SOC per one running of vehicle 10 is large, a cell in battery pack 10 tends to deteriorate fast. In contrast, when an amount of variation in SOC per one running of vehicle 10 is small, a cell in battery pack 110 tends to deteriorate slowly. An amount of variation in SOC per one running of a vehicle may be referred to as "ΔSOC" below.

Figure 5:
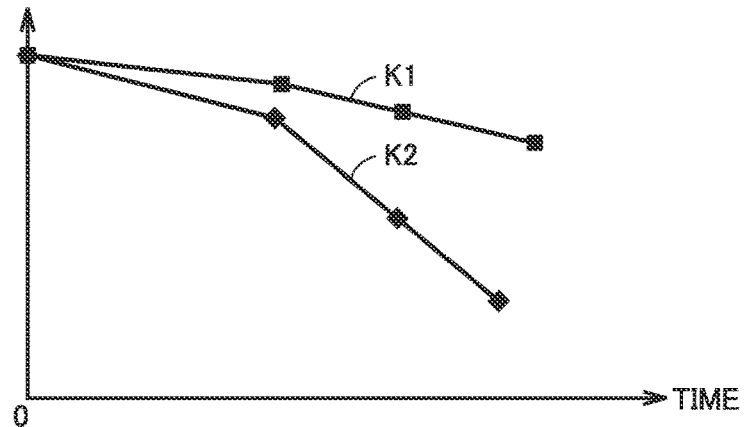
FIG. 5 is a diagram showing a difference in rate of deterioration of a cell between an example in which an amount of variation in SOC is small and an example in which an amount of variation in SOC is large.

FIG. 5 is a diagram showing a difference in rate of deterioration of a cell between an example in which ΔSOC is small and an example in which ΔSOC is large. A solid line K1 represents change over time in capacity retention of battery pack 110 in usage small in ΔSOC. Change over time in capacity retention of battery pack 110 in which charging and discharging is repeatedly performed in such usage is shown with solid line K1 in FIG. 5. A solid line K2 represents change over time in capacity retention of battery pack 110 in usage large in ΔSOC. Change over time in capacity retention of battery pack 110 in which charging and discharging is repeatedly performed in such usage is shown with solid line K2 in FIG. 5.

Referring to FIG. 5, it is understood based on comparison between solid line K1 and solid line K2 that solid line K2 is higher in rate of lowering in capacity retention of battery pack 110 than solid line K1. The capacity retention of battery pack 110 is estimated to lower due to deterioration of a cell included in a battery assembly in battery pack 110. It is understood from solid line K1 that the cell in battery pack 110 deteriorates slowly when ΔSOC is small. It is understood from solid line K2 that a cell in battery pack 110 deteriorates fast when ΔSOC is large. One of causes for fast deterioration of a cell in battery pack 110 when ΔSOC is large may be because of deterioration of the positive electrode of the cell. In particular, fracture of an active material in the positive electrode is considered to accelerate deterioration of a cell.

As set forth above, a rate of deterioration of a cell constituting a battery assembly in battery pack 110 varies depending on usage of battery pack 110. Rebuilding without taking into consideration a difference in usage of a vehicle for each user does not necessarily lead to a rebuilt product suited to a user. For example, a user who uses battery pack 110 in such a manner as accelerating deterioration of a cell may experience decrease in possible distance of travel by EV running (a distance over which vehicle 10 can run only with electric power from battery pack 110) or increase in frequency of rebuilding.

In battery management system 1 according to this embodiment, a rebuilt product is produced in consideration of a difference in usage of a vehicle for each user. Generally, in battery management system 1, an amount of variation in SOC (ΔSOC) per one running of battery pack 110 used in vehicle 10 is obtained. When ΔSOC is large, a rebuilt product is produced by using a cell (replacement cell) which is less likely to deteriorate than a cell (replacement cell) employed when ΔSOC is small. By thus producing a rebuilt product, a rebuilt product excellent in resistance against deterioration can be provided to a user who uses battery pack 110 in such a manner as accelerating deterioration of a cell. For a user who uses battery pack 110 in such a manner that deterioration of a cell gradually progresses, a rebuilt product which has resistance against deterioration sufficient for that user and also advantageous in an aspect other than deterioration can be provided.

Figure 6:
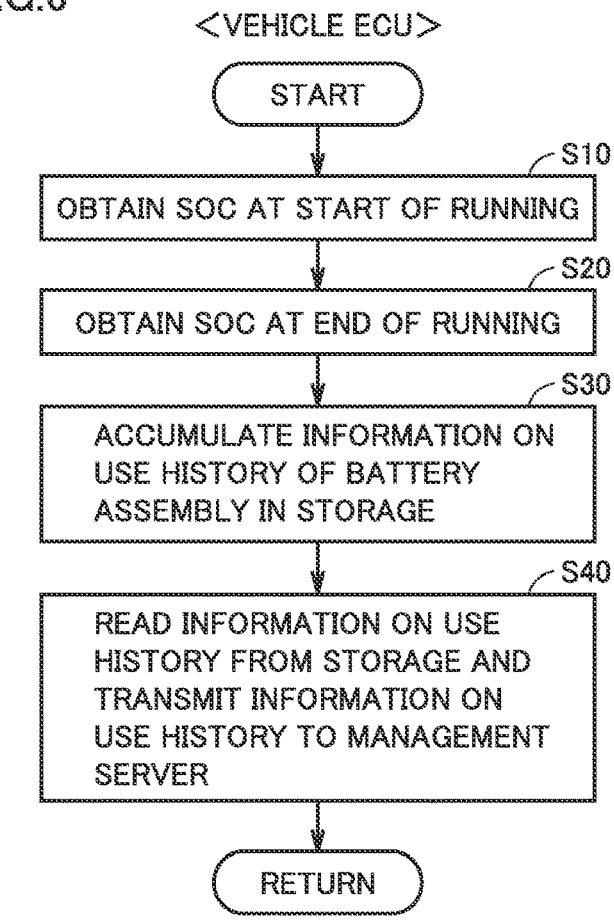
FIG. 6 is a flowchart illustrating a procedure in processing performed by an ECU of a vehicle.

FIG. 6 is a flowchart illustrating a procedure in processing performed by ECU 150 of vehicle 10. As a series of processing shown in FIG. 6 is repeatedly performed, an SOC of battery pack 110 (battery assembly) at the time of start of running (which is referred to as an "SOC at start of running" below) and an SOC of battery pack 110 (battery assembly) at the time of end of running (which is referred to as an "SOC at end of running" below) are output to storage 160 each time vehicle 10 runs. In an example shown below, one running corresponds to a period from end of external charging (corresponding to start of running) until start of next external charging (corresponding to end of running).

External charging of battery pack 110 is started by a request for charging issued to charging facilities while an external power supply of the charging facilities and vehicle 10 are connected to each other through a charge cable. External charging is quitted by a request for stop of charging issued to the charging facilities. Battery pack 110 is not necessarily charged to a fully charged state. Charging can be stopped at any timing indicated by a user.

Referring to FIG. 6, ECU 150 calculates an SOC at the timing of end of external charging of battery pack 110 as an SOC at start of running (step S10).

Vehicle 10 fed with power by external charging runs with electric power stored in battery pack 110. As electric power of battery pack 110 is consumed by running of vehicle 10, a user charges battery pack 110 again. Namely, the user performs next external charging. ECU 150 calculates an SOC at the timing of start of this external charging as an SOC at end of running (step S20).

ECU 150 has storage 160 accumulate information on a use history of battery pack 110 (battery assembly) obtained during a period from end of previous running until end of present running (step S30). The information on the use history of battery pack 110 includes the SOC at start of running and the SOC at end of running calculated in steps S10 and S20. The information on the use history of battery pack 110 may further include an amount of charging in external charging, the number of times of charging of battery pack 110, and a distance of travel of vehicle 10. The amount of charging in external charging corresponds to an amount of increase in SOC during a period from start of charging by an external power supply until end of that charging.

ECU 150 then reads the information on the use history of battery pack 110 accumulated in storage 160 from storage 160 and transmits the use history information to management server 20 through communication device 170 (step S40). ECU 150 transmits the information on the use history of battery pack 110 to management server 20 each time one running ends.

Steps S10, S20, and S30 in FIG. 6 may be modified as below. In an example shown below, one running corresponds to one trip (a period from launch of a vehicle system until next stop). More specifically, one running corresponds to a period from a time point of turn-on of an ignition (start of running) until a time point of turn-off of the ignition (end of running).

Referring to FIG. 6, ECU 150 obtains a voltage value and a current value of a battery assembly included in battery pack 110 at the time when the ignition of vehicle 10 is turned on and calculates an SOC at start of running based on the obtained voltage value and current value (step S10).

Then, ECU 150 obtains a voltage value and a current value of the battery assembly included in battery pack 110 at the time when the ignition of vehicle 10 is turned off and calculates an SOC at end of running based on the obtained voltage value and current value (step S20).

ECU 150 has storage 160 accumulate information on a use history of battery pack 110 (battery assembly) obtained during a period from end of previous running until end of present running (step S30). The information on the use history of battery pack 110 includes the SOC at start of running and the SOC at end of running calculated in steps S10 and S20.

Then, ECU 150 reads the information on the use history of battery pack 110 accumulated in storage 160 from storage 160 and transmits the use history information to management server 20 through communication device 170 (step S40).

According to the method, even vehicle 10 which is not an externally chargeable vehicle can obtain an SOC at start of running and an SOC at end of running of a battery pack mounted on vehicle 10.

Through the processing shown in FIG. 6, ECU 150 obtains information on a use history of battery pack 110 and transmits the use history information to management server 20. Management server 20 then accumulates the received information on the use history of battery pack 110 in battery information DB 240. The information on the use history of battery pack 110 may be transmitted to management server 20 by ECU 150 (step S40 may be performed) at any timing. For example, in step S40, ECU 150 may periodically read the information on the use history of battery pack 110 accumulated in storage 160 from storage 160 with a prescribed period and transmit the use history information to management server 20 through communication device 170. Specifically, when timing to perform step S40 has not yet come, step S40 may be skipped and steps S10 to S30 may repeatedly be performed. In this case, steps S10 to S30 are performed each time vehicle 10 runs, and ECU 150 outputs the information on the use history of battery pack 110 (the SOC at start of running and the SOC at end of running) to storage 160 each time vehicle 10 runs. Thus, each time vehicle 10 runs, the information on the use history of battery pack 110 (the SOC at start of running and the SOC at end of running) is accumulated in storage 160. Then, when timing to perform step S40 comes, the information on the use history of battery pack 110 obtained during a period from previous transmission until present transmission is collectively transmitted to management server 20 in step S40.

FIG. 7 is a flowchart illustrating a procedure in processing performed by management server 20. Processing shown in the flowchart is performed when information for identifying vehicle 10 (vehicle of interest) of which battery pack 110 is to be replaced is received from terminal device 45 of dealer 35.

Referring to FIG. 7, management server 20 (information processing apparatus 210) receives information on a vehicle of interest (vehicle 10) from terminal device 45 of dealer 35 (step S110). Then, management server 20 obtains information on a use history (an SOC at start of running and an SOC at end of running) of a battery assembly (battery pack 110) of the vehicle of interest (vehicle 10) from battery information DB 240 (step S120). That is, management server 20 obtains, from battery information DB 240, the information on the use history of the battery assembly (battery pack 110) of the vehicle of interest (vehicle 10) identified by the information received from terminal device 45.

Then, management server 20 obtains an amount of variation in SOC (ΔSOC) per one running of battery pack 110 which was used in vehicle 10 by using the information on the use history (the SOC at start of running and the SOC at end of running) of battery pack 110 of vehicle 10 obtained from battery information DB 240 (step S130). Specifically, management server 20 calculates an amount of variation in SOC for each of a plurality of times of running during a period of interest (a prescribed period) by subtracting the SOC at start of running from the SOC at end of running in data on each running. A value calculated by subtracting the SOC at the time of start of next external charging (the SOC at end of running) from the SOC at the time of end of external charging (the SOC at start of running) corresponds to an amount of lowering in SOC during a period from end of charging by an external power supply until start of next charging. The amount of lowering in SOC corresponds to an amount of consumption in one running of electric power stored in battery pack 110. The period of interest can arbitrarily be set. For example, all running data received from vehicle 10 during a whole period may be taken into consideration. Alternatively, only most recent running data during a most recent period (a period from the current time point back to a time point a predetermined period before the current time point) may be taken into consideration. Alternatively, all running data during a period of interest may be taken into consideration or prescribed running data may be excluded. For example, data short in distance or time period of one running may be excluded. Then, management server 20 calculates a median value of a plurality of pieces of obtained data (amounts of variation in SOC in a plurality of times of running). The obtained median value of the amounts of variation in SOC corresponds to an amount of variation in SOC (ΔSOC) per one running.

Then, management server 20 determines in steps S141 and S142 which of cells A to C is a suited cell suited to rebuilding (replacement of a cell) based on the ΔSOC. In steps S151 to S153, one of cells A to C is selected and rebuilding information for rebuilding with the selected cell is generated.

FIG. 8 is a diagram showing replacement cells (cells A to C) selected in steps S151 to S153. Cell A is a replacement cell which satisfies a requirement that a thickness of a positive electrode is small (thin) and a weight per unit area of the positive electrode is light (small). Cell B is a replacement cell which satisfies a requirement that a thickness of the positive electrode is intermediate (standard) and a weight per unit area of the positive electrode is intermediate (standard). Cell C is a replacement cell which satisfies a requirement that a thickness of the positive electrode is large (thick) and a weight per unit area of the positive electrode is heavy (large). Cells C, B, and A are greater in thickness of the positive electrode in this order. A numeric range of a thickness of the positive electrode in each cell can arbitrarily be set so long as this relation is satisfied. Cells A, B, and C are lighter in weight per unit area of the positive electrode in this order. A numeric range of a weight per unit area of the positive electrode in each cell can arbitrarily be set so long as this relation is satisfied. Each of cells A to C is, for example, a lithium ion battery.

Less likeliness of deterioration of a cell is different depending on a material or a structure of the cell. For example, an active material of a lithium ion battery can release or take in lithium ions by being given a prescribed potential. The positive electrode of the lithium ion battery takes in lithium ions during charging and releases lithium ions during discharging. The positive electrode expands by taking in lithium ions and shrinks by releasing lithium ions. When charging and discharging of the lithium ion battery is repeatedly performed, the positive electrode of the lithium ion battery repeats expansion and shrinkage. Thus, the structure of the positive electrode alters and a capacity of the positive electrode tends to lower. This may be because the positive electrode is less likely to take in lithium ions due to change in structure of the positive electrode.

The inventor of the present application has experimentally found that a lithium ion battery is less likely to deteriorate by making a thickness of a positive electrode of the lithium ion battery smaller. Specifically, a lithium ion battery including a positive electrode small in thickness is high in capacity retention when charging and discharging is repeatedly performed. Furthermore, the inventor of the present application has experimentally found that a lithium ion battery is less likely to deteriorate by decreasing a weight per unit area of a positive electrode of the lithium ion battery. Specifically, a lithium ion battery light in weight per unit area of the positive electrode is high in capacity retention when charging and discharging is repeatedly performed. The weight per unit area refers to an amount of an active material per unit area. A metal oxide (for example, a lithium oxide) is preferred for a positive electrode of a secondary battery (replacement cell).

As set forth above, a cell is less likely to deteriorate as a positive electrode of the cell is smaller in thickness. In addition, a cell is less likely to deteriorate as a weight per unit area of the positive electrode of the cell is lighter. Therefore, cells A to C shown in FIG. 8 are higher in resistance against deterioration in the order of cell A (resistance against deterioration: high), cell B (resistance against deterioration: intermediate), and cell C (resistance against deterioration: low).

For cells A to C, a numeric range of each of a thickness and a weight per unit area of the positive electrode is preferably set within a range of process variation of each cell. When characteristics of battery pack 110 are not greatly varied by rebuilding, a rebuilt product can appropriately operate without modifying a peripheral circuit of battery pack 110. It is expected that inventories of replacement cells which fall under any of cells A to C are more readily secured by recycling a battery pack identical in specifications to battery pack 110.

For example, for a numeric range of a thickness of the positive electrode, a range in the vicinity of a median value of process variation (for example, not smaller than "a median value−a prescribed value" and not greater than "a median value+a prescribed value") may be set as a numeric range for cell B, a range not smaller than "a lower limit value of process variation" and smaller than "a lower limit value of the numeric range of cell B" may be set as a numeric range for cell A, and a range exceeding "an upper limit value of the numeric range of cell B" and not greater than "an upper limit value of process variation" may be set as a numeric range for cell C. If the lower limit value, the median value, and the upper limit value of process variation in connection with a thickness of the positive electrode are 10, 20, and 30, respectively, a numeric range of a thickness of the positive electrode of each cell can be set within a range of process variation of each cell by setting a numeric range for cell B to be "not smaller than 15 and not greater than 25," setting a numeric range for cell A to be "not smaller than 10 and smaller than 15," and setting a numeric range for cell C to be "greater than 25 and not greater than 30." This is also applicable to a numeric range of a weight per unit area of the positive electrode.

Referring again to FIG. 7, in step S141, management server 20 determines whether or not ΔSOC obtained in step S130 is greater than a second threshold value Th2. Any numeric value can be set as second threshold value Th2. For example, a numeric value selected from a range not lower than 55% and not higher than 75% is set as second threshold value Th2. Second threshold value Th2 may simply be referred to as "Th2" below.

When management server 20 determines that ΔSOC is greater than Th2 (YES in step S141), it generates rebuilding information for rebuilding with cell A (FIG. 8) (step S151). Specifically, management server 20 selects cells to be used for rebuilding in number necessary for production of a rebuilt product by referring to recycled product DB 230 which stores information on recyclable cells (replacement cells). A cell which falls under cell A is preferentially selected. Preferably, only a cell which falls under cell A is selected. When inventories of cells (replacement cells) which fall under cell A are insufficient by referring to recycled product DB 230, management server 20 selects another cell under prescribed criteria. Thus, in step S151, rebuilding information (third rebuilding information) indicating that cell A (a third cell) is a suited cell is generated.

When it is determined in step S141 that ΔSOC is not greater than Th2 (NO in step S141), management server 20 determines whether or not ΔSOC obtained in step S130 is greater than a first threshold value Th1 (step S142). Any numeric value smaller than Th2 can be set as first threshold value Th1. For example, a numeric value selected from a range not lower than 25% and not higher than 50% is set as first threshold value Th1. First threshold value Th1 may simply be referred to as "Th1" below.

When management server 20 determines that ΔSOC is greater than Th1 (YES in step S142), it generates rebuilding information for rebuilding with cell B (FIG. 8) (step S152). Specifically, management server 20 selects cells to be used for rebuilding in number necessary for production of a rebuilt product by referring to recycled product DB 230 which stores information on recyclable cells (replacement cells). A cell which falls under cell B is preferentially selected. Preferably, only a cell which falls under cell B is selected. When inventories of cells (replacement cells) which fall under cell B are insufficient by referring to recycled product DB 230, management server 20 selects another cell under prescribed criteria. Thus, in step S152, rebuilding information (second rebuilding information) indicating that cell B (a second cell) is a suited cell is generated.

When management server 20 determines in step S142 that ΔSOC is not greater than Th1 (NO in step S142), it generates rebuilding information for rebuilding with cell C (FIG. 8) (step S153). Specifically, management server 20 selects cells to be used for rebuilding in number necessary for production of a rebuilt product by referring to recycled product DB 230 which stores information on recyclable cells (replacement cells). A cell which falls under cell C is preferentially selected. Preferably, only a cell which falls under cell C is selected. When inventories of cells (replacement cells) which fall under cell C are insufficient by referring to recycled product DB 230, management server 20 selects another cell under prescribed criteria. Thus, in step S153, rebuilding information (first rebuilding information) indicating that cell C (a first cell) is a suited cell is generated.

In each of steps S151 to S153, for example, rebuilding information can be generated by referring to traceability data (initial thickness and weight per unit area of the positive electrode) of a cell stored in recycled product DB 230. Without being limited thereto, rebuilding information may be generated by referring to information on a used cell (a thickness and a weight per unit area of the positive electrode measured after use).

When rebuilding information is generated in any of steps S151 to S153, management server 20 transmits a command to produce a rebuilt product in accordance with the generated rebuilding information to terminal device 44 of battery pack manufacturer 34 (step S160). Thus, battery pack manufacturer 34 produces a rebuilt product of battery pack 110 to be mounted on vehicle 10. A rebuilt product in accordance with such rebuilding information has characteristics suited to a user of vehicle 10. Management server 20 transmits the generated rebuilding information to terminal device 45 of dealer 35 to which vehicle 10 has been brought (step S170).

A cell may be replaced at any timing, and may be replaced, for example, at the timing of periodic maintenance. Management server 20 may find appropriate timing of replacement of a cell based on information on a use history of battery pack 110 (for example, the number of times of charging of battery pack 110 and a distance of travel of vehicle 10) and notify a user of the timing when that timing comes.

In battery management system 1 according to the embodiment, an amount of variation in SOC (ΔSOC) per one running of battery pack 110 used in vehicle 10 is obtained (step S130). When ΔSOC is great, a rebuilt product is produced by using a cell high in resistance against deterioration (cell A) (step S151). When ΔSOC is intermediate, a rebuilt product is produced by using a cell intermediate in resistance against deterioration (cell B) (step S152). When ΔSOC is small, a rebuilt product is produced by using a cell low in resistance against deterioration (cell C) (step S153). Cell C selected in step S153 is suitable for increase in capacity. Specifically, a capacity of a cell tends to be higher as an electrode is larger in thickness. A capacity of a cell tends to be higher as a weight per unit area is heavier. Therefore, cell C is suitable for increase in capacity.

By producing a rebuilt product as set forth above, a rebuilt product excellent in resistance against deterioration can be provided to a user who uses battery pack 110 in such a manner as accelerating deterioration of a cell. For a user who uses battery pack 110 in such a manner that deterioration of a cell gradually progresses, a rebuilt product high in capacity which has resistance against deterioration sufficient for that user can be provided. Thus, in battery management system 1, an appropriate replacement cell is selected in consideration of a difference in usage of vehicle 10 for each user.

In the embodiment, battery packs are categorized into three groups depending on usage of a vehicle by a user (ΔSOC: large, ΔSOC: intermediate, and ΔSOC: small) so that an appropriate replacement cell (any of cells A to C) is selected. Categorization into three groups is higher in appropriateness of replacement cells than categorization into two groups. A certain effect, however, is achieved even in an example of categorization into two groups.

For example, instead of cells A to C shown in FIG. 8, cells A and B shown in FIG. 9 may be used for rebuilding. FIG. 10 is a flowchart illustrating a procedure in processing performed by management server 20 in a modification in which the replacement cells (cells A and B) shown in FIG. 9 are adopted.

Referring to FIG. 10, management server 20 performs steps S210 to S230 in conformity with steps S110 to S130 in FIG. 7. Then, management server 20 determines in step S240 which of cells A and B is a suited cell suited to rebuilding (replacement of a cell). In steps S251 and S252, either cell A or B is selected and rebuilding information for rebuilding with the selected cell is generated. In steps S240, S251, and S252, processing in conformity with steps S142, S152, and S153 in FIG. 7 is performed. Then, management server 20 performs steps S260 and S270 in conformity with steps S160 and S170 in FIG. 7.

As set forth above, when battery packs are categorized into two groups based on usage of a vehicle by a user (ΔSOC: large and ΔSOC: small) as well, an appropriate replacement cell is selected in consideration of a difference in usage of vehicle 10 for each user. A rebuilt product with characteristics suited to a user of vehicle 10 is thus produced.

In step S141 in FIG. 7, determination as NO is made when ΔSOC and Th2 are equal to each other and the process proceeds to step S142. Without being limited thereto, step S141 may be modified such that determination as YES is made when ΔSOC and Th2 are equal to each other, and the process proceeds to step S151. This is also applicable to step S142 in FIG. 7 and step S240 in FIG. 10.

In the embodiment, a thickness and a weight per unit area of the positive electrode are adopted as indicators indicating less likeliness of deterioration of a cell (FIG. 8). Specifically, this indicator serves as a basis for determination that a cell is less likely to deteriorate as a positive electrode of the cell is smaller in thickness and that a cell is less likely to deteriorate as a weight per unit area of the positive electrode of the cell is lighter. Without being limited as such, only any one of a thickness and a weight per unit area of the positive electrode may be adopted as the indicator indicating less likeliness of deterioration of a cell.

For example, replacement cells (cells A to C) categorized based only on a thickness of the positive electrode as shown in FIG. 11 may be used for rebuilding. Cells A, B, and C shown in FIG. 11 are higher in resistance against deterioration in this order.

When a thickness and a weight per unit area of the positive electrode are adopted as indicators indicating less likeliness of deterioration of a cell, categorization as shown in FIG. 12 can also be made. In FIG. 12, cell A is a replacement cell which satisfies a requirement that a thickness of a positive electrode is small (thin) and a weight per unit area of the positive electrode is extremely light (very small). Cell B is a replacement cell which satisfies a requirement that a thickness of the positive electrode is small (thin) and a weight per unit area of the positive electrode is light (small). Cell C is a replacement cell which satisfies a requirement that a thickness of the positive electrode is intermediate (standard) and a weight per unit area of the positive electrode is intermediate (standard). A cell D is a replacement cell which satisfies a requirement that a thickness of the positive electrode is large (thick) and a weight per unit area of the positive electrode is heavy (large). A cell E is a replacement cell which satisfies a requirement that a thickness of the positive electrode is large (thick) and a weight per unit area of the positive electrode is extremely heavy (very large). Cells A to E shown in FIG. 12 are higher in resistance against deterioration in this order.

When such replacement cells are employed, battery packs are categorized into five groups based on usage of a vehicle by a user ($\Delta$SOC: extremely large, $\Delta$SOC: large, $\Delta$SOC: intermediate, $\Delta$SOC: small, and $\Delta$SOC: extremely small), and an appropriate replacement cell (one of cells A to E) suited to each battery pack can be selected. A cell determined as being relatively less likely to deteriorate based on various indicators can be adopted as a cell which is less likely to deteriorate.

In the embodiment, management server 20 (battery information obtaining device) obtains an amount of variation in SOC for each of a plurality of times of running during a period of interest (a prescribed period) and finds a median value of the obtained amounts of variation in SOC (step S130). Without being limited as such, an average value rather than a median value can also be calculated from amounts of variation in SOC for each of a plurality of times of running. For example, an amount of variation in SOC may be obtained for each of a plurality of times of running during a most recent period (a period from the current time point back to a time point a predetermined period before the current time point) and an average value of the obtained amounts of variation in SOC may be calculated. When vehicle 10 is used in various ways of use, a median value rather than an average value tends to reflect common usage by a user. Therefore, appropriateness of a replacement cell can be enhanced by setting a median value of amounts of variation in SOC as an amount of variation in SOC per one running.

Management server 20 (battery information obtaining device) may be configured to be able to calculate both of a median value and an average value of amounts of variation in SOC and any of a median value and an average value of the amounts of variation in SOC may be adopted depending on a type of a vehicle of interest (vehicle 10). For example, when a vehicle of interest (vehicle 10) is a work vehicle (for example, a truck) used only in a specific application, an average value of amounts of variation in SOC may be adopted, and when a vehicle of interest (vehicle 10) is another vehicle (for example, a passenger car), a median value of amounts of variation in SOC may be adopted.

In the embodiment, vehicle 10 transmits an SOC at start of running and an SOC at end of running to management server 20 and management server 20 calculates $\Delta$SOC based on the SOC at start of running and the SOC at end of running. Without being limited as such, vehicle 10 may calculate a difference between an SOC at start of running and an SOC at end of running each time the vehicle runs, and the calculated value (=the SOC at start of running–the SOC at end of running) may be transmitted to management server 20.

When information on a use history of battery pack 110 received from vehicle 10 includes an amount of charging in external charging (an amount of increase in SOC during a period from start of charging by the external power supply until end of that charging), management server 20 may calculate $\Delta$SOC based on the amount of charging in external charging. Specifically, management server 20 may adopt an amount of charging per one external charging (for example, a median value or an average value) as $\Delta$SOC. Normally, electric power consumed in previous running or electric power which will be consumed in next running is charged in one external charging. Therefore, an amount of charging per one external charging can be regarded as an amount of consumption per one running of electric power stored in battery pack 110.

In the embodiment, information on a use history of battery pack 110 (battery assembly) of vehicle 10 is collected by management server 20 and management server 20 calculates $\Delta$SOC (an amount of variation in SOC per one running) and generates replacement information (rebuilding information in the embodiment) for selecting a suited cell suited to replacement of a cell. Without being limited as such, information on a use history of battery pack 110 may be accumulated in vehicle 10. For example, vehicle 10 may be connected to terminal device 45 of dealer 35 when vehicle 10 is brought to dealer 35, and information on a use history of battery pack 110 accumulated in vehicle 10 may be transmitted from terminal device 45 to management server 20. Replacement information may be generated in any of terminal devices 41 to 45 shown in FIG. 3 or a separately provided terminal device instead of management server 20. For example, management server 20 or vehicle 10 may calculate $\Delta$SOC based on information on a use history of battery pack 110 and the calculated $\Delta$SOC may be transmitted to a terminal device which generates replacement information. Alternatively, ECU 150 of vehicle 10 may generate replacement information.

Various known techniques can be used for a method of determining an SOC. Vehicle 10 may be a vehicle which cannot externally be charged.

Examples

FIG. 13 shows a result of evaluation of a capacity retention before and after running and a possible distance of travel of a rebuilt product according to the embodiment and a rebuilt product according to a Comparative Example.

A battery management system according to the embodiment performs processing in FIG. 6 and processing in FIG. 7 described previously. In the processing in FIG. 6, an SOC at the time of end of external charging was defined as an SOC at start of running and an SOC at the time of start of next external charging was defined as an SOC at end of running. In the processing in FIG. 7, first threshold value Th1 was set to 35% and second threshold value Th2 was set to 60%. In step S130 in FIG. 7, a median value ($\Delta$SOC) of amounts of variation in SOC was found. For cells A to C (FIG. 8), a numeric range of each of a thickness and a weight per unit area of the positive electrode was set within a range of process variation of each cell.

A battery management system according to a Comparative Example was different from the battery management system according to the embodiment only in that cell B was selected in all of steps S151 to S153 in FIG. 7.

A battery pack of which ΔSOC was 76% was to be rebuilt in each of the embodiment and the Comparative Example. Specifically, a battery pack repeatedly charged and discharged in such a manner that use of the battery pack was started from a state of the SOC of 91%, electric power in the battery pack was consumed in running of a vehicle until the SOC of the battery pack attained to 15%, and thereafter the battery pack was externally charged to restore the SOC of the battery pack back to 91% was to be rebuilt.

Since ΔSOC (76%) of the battery pack to be rebuilt was higher than second threshold value Th2 (60%), in the battery management system according to the embodiment, rebuilding information for rebuilding with cell A (FIG. 8) was generated in step S151. In the battery management system according to the Comparative Example, in step S151, rebuilding information for rebuilding with cell B (FIG. 8) was generated. Rebuilt products in accordance with the rebuilding information generated in each of the embodiment and the Comparative Example were produced and a capacity retention before and after running and a possible distance of travel of each rebuilt product were evaluated. In evaluation of a capacity retention, a vehicle incorporating the rebuilt product was subjected to a running test in which a distance of travel was set to approximately 56000 km, and a ratio of a capacity of the rebuilt product after the running test to a capacity of the rebuilt product before the running test (capacity retention) was determined. In evaluation of the possible distance of travel, a possible distance of travel of a vehicle incorporating the rebuilt product when it run only with electric power stored in the rebuilt product was measured.

Referring to FIG. 13, in evaluation of any of a capacity retention and a possible distance of travel, the rebuilt product according to the embodiment was higher than the rebuilt product according to the Comparative Example. Specifically, a capacity retention (98.5%) of the rebuilt product according to the embodiment was higher than a capacity retention (90.8%) of the rebuilt product according to the Comparative Example. A possible distance of travel (approximately 296 km) of the rebuilt product according to the embodiment was longer than a possible distance of travel (approximately 272 km) of the rebuilt product according to the Comparative Example. It is understood from these results that the rebuilt product according to the embodiment was longer in lifetime than the rebuilt product according to the Comparative Example.

Though an embodiment of the present disclosure has been described above, it should be understood that the embodiment disclosed herein is illustrative and non-restrictive in every respect. The scope of the present invention is defined by the terms of the claims and is intended to include any modifications within the scope and meaning equivalent to the terms of the claims.

What is claimed is:

1. A battery information processing apparatus in combination with a battery manufacturing support apparatus, which processes information for manufacturing a battery assembly including a plurality of cells,
    the battery information processing apparatus comprising:
        a battery information obtaining device configured to obtain an amount of variation in state of charge (SOC) per one running of the battery assembly used in a vehicle, wherein the amount of variation in SOC per one running of the battery assembly corresponds to one of (i) a median value of amounts of variation in SOC for each of a plurality of times of running of the battery assembly during a predetermined period of time, or (ii) an average value of amounts of variation in SOC for each of the plurality of times of running of the battery assembly during the predetermined period of time; and
        a replacement information generator configured to generate replacement information, for selecting a replacement cell from among a plurality of replacement cells, which is to replace a cell included in the battery assembly of the vehicle, based on the amount of variation in SOC,
    the replacement information generator being configured to
        generate first replacement information when the amount of variation in SOC is smaller than a first threshold value, and
        generate second replacement information when the amount of variation in SOC is greater than the first threshold value,
    the first replacement information indicating that a first cell is the replacement cell, and
    the second replacement information indicating that a second cell is the replacement cell, the second cell being determined as being less likely to deteriorate than the first cell based on a prescribed indicator, the prescribed indicator indicating less likeliness of deterioration of a cell,
    the battery manufacturing support apparatus comprising:
        an obtaining device configured to obtain the first and second replacement information generated by the battery information processing apparatus;
        a selector configured to select the replacement cell in accordance with the first and second replacement information obtained by the obtaining device; and
        wherein the battery manufacturing support apparatus produces a rebuilt battery assembly including the replacement cell for the vehicle.

2. The battery information processing apparatus according to claim 1, wherein
    the replacement information generator is configured to generate third replacement information when the amount of variation in SOC is greater than a second threshold value,
    the second threshold value is greater than the first threshold value,
    the third replacement information indicates that a third cell is the replacement cell, the third cell being determined as being less likely to deteriorate than the second cell based on the indicator, and
    when the amount of variation in SOC is greater than the first threshold value and smaller than the second threshold value, the replacement information generator is configured to generate the second replacement information.

3. The battery information processing apparatus according to claim 1, wherein
    the vehicle is configured such that the plurality of cells are chargeable with electric power from an external power supply outside the vehicle, and
    the amount of variation in SOC is calculated by using an amount of lowering in SOC during a period from end of charging by the external power supply until start of next charging.

4. The battery information processing apparatus according to claim 1, wherein
the vehicle is configured such that the plurality of cells are chargeable with electric power from an external power supply outside the vehicle, and
the amount of variation in SOC is calculated by using an amount of increase in SOC during a period from start of charging by the external power supply until end of that charging.

5. The battery information processing apparatus according to claim 1, wherein
the replacement cells are each determined as being less likely to deteriorate based on the indicator as a positive electrode is smaller in thickness.

6. The battery information processing apparatus according to claim 1, wherein
the replacement cells are each determined as being less likely to deteriorate based on the indicator as a weight per unit area of a positive electrode is lighter.

7. The battery information processing apparatus according to claim 1, wherein
the median value is used as the amount of variation in SOC when the vehicle for the rebuilt battery assembly is a passenger vehicle, and
the average value is used as the amount of variation in SOC when the vehicle for the rebuilt battery assembly is a commercial vehicle.

8. A battery assembly manufactured in accordance with replacement information generated by the battery information processing apparatus according to claim 1.

9. A battery information processing method of processing information for manufacturing a battery assembly including a plurality of cells, and a battery manufacturing method using the information comprising:
obtaining an amount of variation in state of charge (SOC) per one running of the battery assembly used in a vehicle, wherein the amount of variation in SOC per one running of the battery assembly corresponds to one of (i) a median value of amounts of variation in SOC for each of a plurality of times of running of the battery assembly during a predetermined period of time, or (ii) an average value of amounts of variation in SOC for each of the plurality of times of running of the battery assembly during the predetermined period of time; and
generating replacement information for selecting a replacement cell from among a plurality of replacement cells, which is to replace a cell included in the battery assembly of the vehicle, based on the amount of variation in SOC,
the generating replacement information including
comparing the amount of variation in SOC with a first threshold value,
generating first replacement information when the amount of variation in SOC is smaller than the first threshold value, and
generating second replacement information when the amount of variation in SOC is greater than the first threshold value,
the first replacement information indicating that a first cell is the replacement cell, and
the second replacement information indicating that a second cell is the replacement cell, the second cell being determined as being less likely to deteriorate than the first cell based on a prescribed indicator, the prescribed indicator indicating less likeliness of deterioration of a cell,
selecting, based on the first and second replacement information, the replacement cell for replacement of the cell included in the battery assembly from among the replacement cells,
producing a rebuilt battery assembly including the replacement cell for the vehicle.

10. A method of manufacturing a battery assembly including a plurality of cells, the method comprising:
obtaining replacement information for selecting a replacement cell from among a plurality of replacement cells, which is to replace a cell included in the battery assembly of a vehicle;
the replacement information being information generated by using an amount of variation in state of charge (SOC) per one running of the battery assembly used in the vehicle, wherein the amount of variation in SOC per one running of the battery assembly corresponds to one of (i) a median value of amounts of variation in SOC for each of a plurality of times of running of the battery assembly during a predetermined period of time, or (ii) an average value of amounts of variation in SOC for each of the plurality of times of running of the battery assembly during the predetermined period of time,
the replacement information indicating that
a first cell is the replacement cell when the amount of variation in SOC is smaller than a first threshold value, and
a second cell is the replacement cell when the amount of variation in SOC is greater than the first threshold value, the second cell being determined as being less likely to deteriorate than the first cell based on a prescribed indicator, the prescribed indicator indicating less likeliness of deterioration of a cell; and
manufacturing the battery assembly for the vehicle by using the replacement cell selected in accordance with the obtained replacement information.

\* \* \* \* \*